United States Patent
Lei et al.

(10) Patent No.: US 10,598,726 B2
(45) Date of Patent: Mar. 24, 2020

(54) SELF-TEST CIRCUIT AND SELF-TEST METHOD FOR COMPARATOR

(71) Applicant: REALTEK SEMICONDUCTOR CORPORATION, Hsinchu (TW)

(72) Inventors: Liang-Huan Lei, Kaohsiung (TW); Shih-Hsiung Huang, Miaoli County (TW); Chih-Lung Chen, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 62 days.

(21) Appl. No.: 16/136,723

(22) Filed: Sep. 20, 2018

(65) Prior Publication Data
US 2019/0204385 A1 Jul. 4, 2019

(30) Foreign Application Priority Data
Jan. 4, 2018 (TW) .............................. 107100317 A (51) Int. Cl.
*G01R 31/317* (2006.01)
*G01R 31/3187* (2006.01)
*G01R 31/319* (2006.01)

(52) U.S. Cl.
CPC ... *G01R 31/31703* (2013.01); *G01R 31/3187* (2013.01); *G01R 31/31713* (2013.01); *G01R 31/31725* (2013.01); *G01R 31/31924* (2013.01)

(58) Field of Classification Search
CPC ........ G01R 31/31703; G01R 31/31713; G01R 31/31725; G01R 31/3187; G01R 31/31924
See application file for complete search history.

(56) References Cited

U.S. PATENT DOCUMENTS

| 6,763,079 B1* | 7/2004 | Iwamoto | G01R 31/31725 327/156 |
| 8,030,963 B2* | 10/2011 | Ferchland | H03K 19/21 326/104 |
| 2003/0011396 A1* | 1/2003 | Takagi | G01R 31/318552 324/762.01 |

(Continued)

OTHER PUBLICATIONS

Goll, B., et al., "A Measurement Technique to Obtain the Delay Time of a Comparator in 120nm CMOS," Proceedings of the International Conference Mixed Design of Integrated Circuits and System, Conference Location: Gdynia, Poland, Date of Conference: Jun. 22-24, 2006, pp. 563-568. (Year: 2006).*

(Continued)

*Primary Examiner* — Kyle Vallecillo
(74) *Attorney, Agent, or Firm* — WPAT, PC (57) ABSTRACT

A self-test circuit and a self-test method for a comparator are provided. A first output terminal of the comparator is coupled to an input terminal of a first inverter, and a second output terminal of the comparator is coupled to an input terminal of a second inverter. The comparator operates in a reset phase or a comparison phase according to a clock. The self-test method includes steps of: coupling the first output terminal and the second output terminal so that the comparator enters a test mode; and in the test mode, controlling the comparator to operate in the reset phase or the comparison phase according to the clock. In the test mode, the first output terminal and the second output terminal have substantially the same voltage.

18 Claims, 11 Drawing Sheets

(56) References Cited

U.S. PATENT DOCUMENTS

| | | | | |
|---|---|---|---|---|
| 2004/0230388 A1* | 11/2004 | Kim | ............... | G01R 31/31703 |
| | | | | 702/64 |
| 2008/0107209 A1* | 5/2008 | Cheng | ............... | H04L 25/061 |
| | | | | 375/319 |
| 2013/0127549 A1* | 5/2013 | Dreux | ............... | G06F 21/75 |
| | | | | 331/56 |
| 2013/0342260 A1* | 12/2013 | Bohm | ............... | G06F 13/4295 |
| | | | | 327/333 |
| 2014/0333347 A1* | 11/2014 | Kakamu | ............... | H03K 5/249 |
| | | | | 327/76 |

OTHER PUBLICATIONS

Baradaranrezaeii, A., et al., "A 1GS/s low-power low-kickback noise comparator in CMOS process," 2011 20th European Conference on Circuit Theory and Design (ECCTD), Conference Location: Linkoping, Sweden, Date of Conference: Aug. 29-31, 2011, pp. 106-109. (Year: 2011).*

Taiwan Patent Office "Office Action" dated Jun. 25, 2018, Taiwan. OA letter of counterpart TW application(appl. No. 107100317) Concise Summary of Office Action from TIPO: Re: Application No. TW107100317.

Taiwan Patent Office "Search Report" dated Jun. 8, 2018, Taiwan. Search report (TW appl. No. 107100317).

Schinkel et al., "A Low-Offset Double-Tail Latch-Type Voltage Sense Amplifier". pp. 89-94, Nov. 29, 2007, Annual Workshop on Circuits, Systems and Signal Processing (ProRISC), Utrecht.

Miyahara et al., "A Low-Noise Self-Calibrating Dynamic Comparator for High-Speed ADCs" Nov. 3, 2008-Nov. 5, 2008, Department of Physical Electronics, Tokyo Institute of Technology, IEEE Asian Solid-State Circuits Conference, Fukuoka, Japan.

Elzakker et al., "A 1.9 µW 4.4fJ/Conversion-step 10b 1MS/s Charge-Redistribution ADC", 2008, ISSCC 2008 session 12 High-Efficiency Data Converters 12.4, IEEE International Solid-State Circuits Conference.

T. Kobayashi, K. Nogami, T. Shirotori, and Y. Fujimoto, "A current-controlled latch sense amplifier and a static power-saving input buffer for low-power architecture," Solid-State Circuits, IEEE Journal of, vol. 28, pp. 523-527, Apr. 1993.

* cited by examiner

SELF-TEST CIRCUIT AND SELF-TEST METHOD FOR COMPARATOR

BACKGROUND

1. Field of the Disclosure

This disclosure generally relates to comparators, and, more particularly, to self-test circuits and self-test methods for comparators.

2. Description of Related Art

Figure 1:
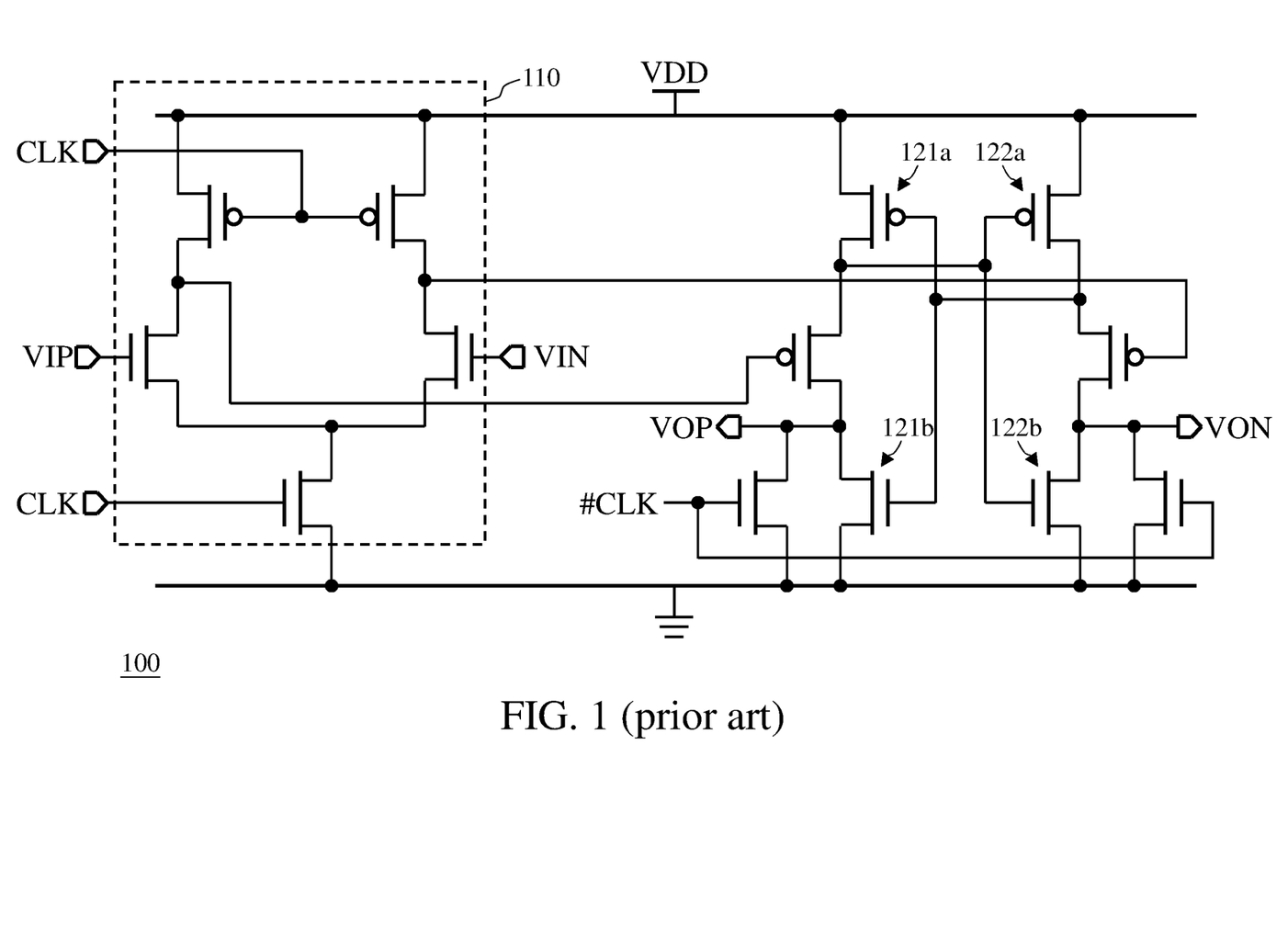
FIG. 1 shows a circuit diagram of a conventional comparator.

FIG. 1 is a circuit diagram of a conventional comparator. The comparator 100 is a two-stage comparator. The first stage includes the five transistors in the preamplifier 110, and the second stage includes the remaining transistors. The second stage of the comparator 100 contains two inverters that are coupled to each other with positive feedback. One of the two inverters is composed of a transistor 121a and a transistor 121b, and the other inverter is composed of a transistor 122a and a transistor 122b. The comparator 100 receives the signals VIP and VIN at the first stage and outputs the signals VOP and VON via the second stage. Controlled by the clock CLK and its inverted signal # CLK, the comparator 100 operates in a reset phase or a comparison phase. When the comparator 100 is applied to a system (e.g., an analog-to-digital converter), the clock CLK can be the operating clock of that system. The operating principles of the comparator 100 are omitted herein as they are thoroughly discussed in the literature Michiel van Elzakker, Ed van Tuijl, Paul Geraedts, Daniel Schinkel, Eric Klumperink, and Bram Nauta "A 1.9 µW 4.4 fJ/Conversion-step 10b 1 MS/s Charge-Redistribution ADC," *IEEE International Solid-State Circuits Conference*, SESSION 12, pp. 244-245, February 2008. If the comparator 100 functions properly, the output signals VOP and VON become each other's inverted signal at the end of the comparison phase.

Figure 2:
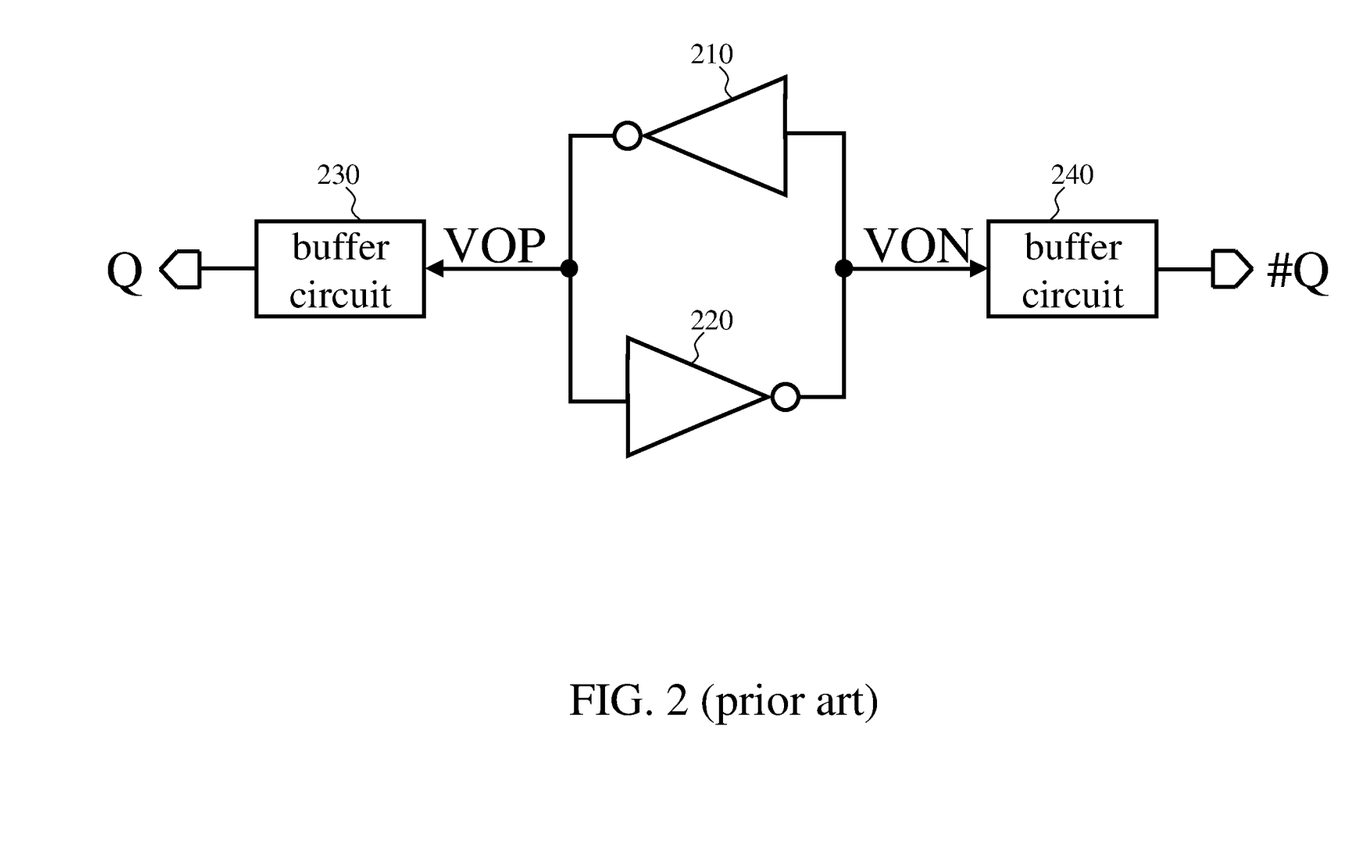
FIG. 2 shows a circuit diagram showing the two inverters of the second stage of the comparator 100 connected in series with the buffer circuits.

In practical applications, the buffer circuits are often employed to perform waveform shaping on the output signals of the comparator 100 as well as to improve their driving capability. FIG. 2 is a circuit diagram showing the two inverters in the second stage of the comparator 100 connected in series with the buffer circuits. The inverter 210 is composed of the transistor 121a and the transistor 121b, and the inverter 220 is composed of the transistor 122a and the transistor 122b. The buffer circuit 230 shapes and enhances the output signal VOP and generates the signal Q accordingly; similarly the buffer circuit 240 shapes and enhances the output signal VON and generates the signal # Q accordingly. The buffer circuit 230 and the buffer circuit 240 may each include an inverter or multiple inverters connected in series. It is assumed in the following discussion that the signal Q and the output signal VOP are each other's inverted signal, and the signal # Q and the output signal VON are each other's inverted signal, and that the voltage levels of the output signal VOP and the output signal VON are LOW (logic 0) when the comparator 100 is reset in the reset phase.

Figure 3A:
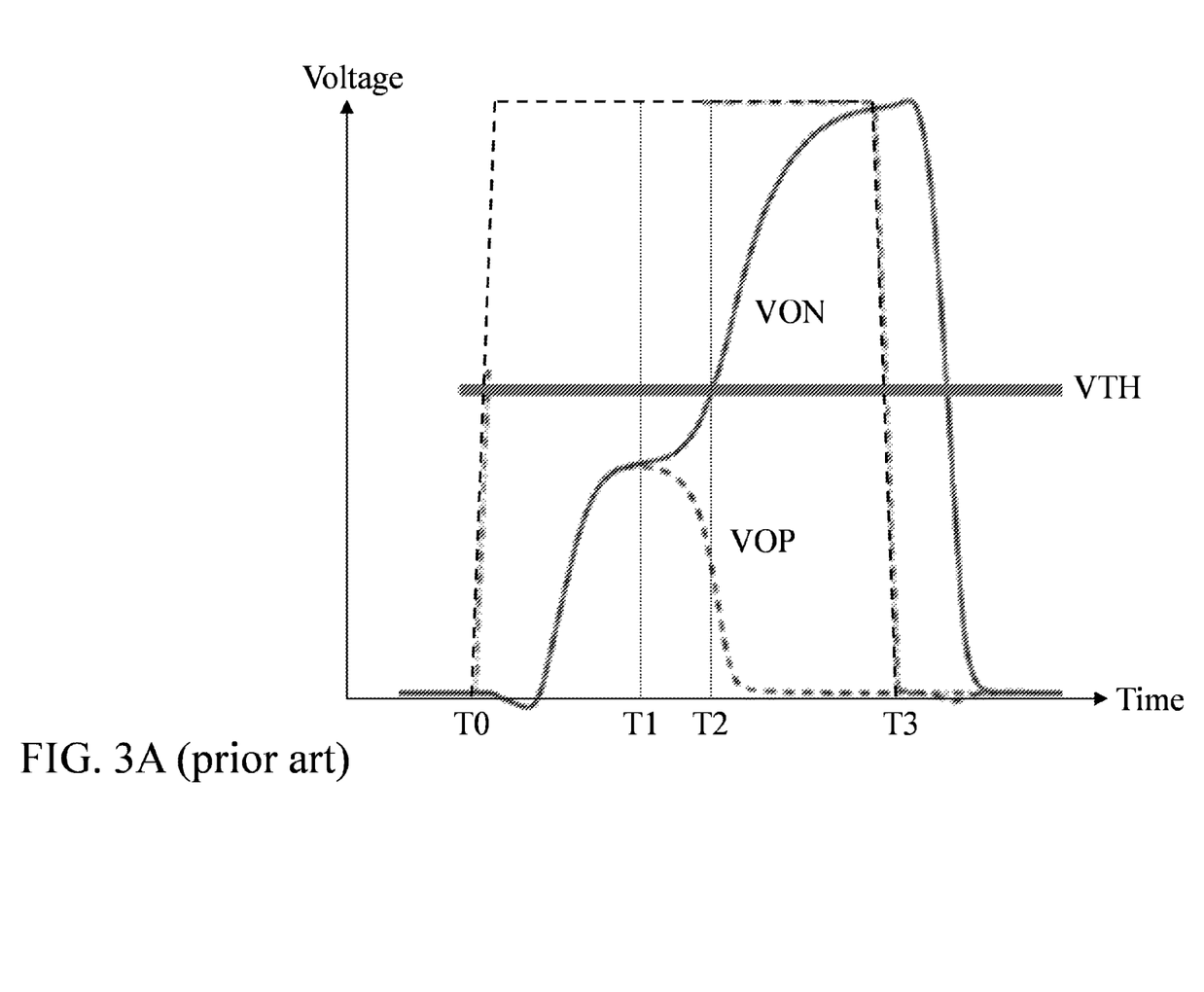
FIGS. 3A and 3B show the waveforms of the output signal VOP and the output signal VON as well as the transition voltage of the buffer circuit.
Figure 3B:
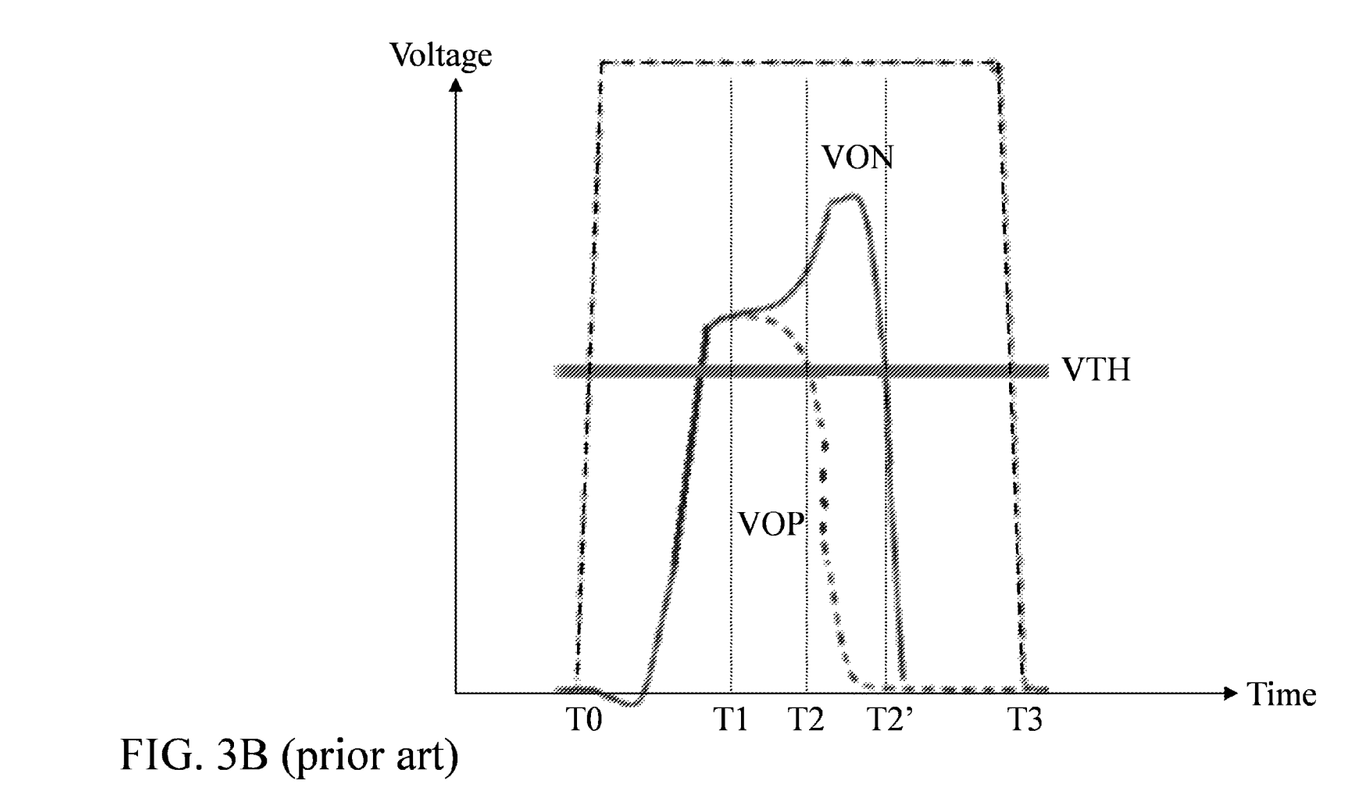

FIGS. 3A and 3B show the waveforms of the output signal VOP and the output signal VON as well as the transition voltage of the buffer circuit. The transition voltage VTH of the buffer circuit can be referred to the transition voltage of the first-stage inverter of the buffer circuit 230 or the buffer circuit 240, the first-stage inverter being the inverter that directly receives the output signal VOP or the output signal VON. When the output signal VOP or the output signal VON changes from a signal below the transition voltage VTH to a signal above the transition voltage VTH (and vice versa), a level transition occurs to the signal Q or the signal # Q. In FIGS. 3A and 3B, the duration from time T0 to time T3 is a comparison phase of the comparator 100. Before the comparison phase starts, the output signal VOP and the output signal VON have equal voltage, that is, the voltages of the signal Q and the signal # Q are equal.

As shown in FIG. 3A, at time T1, the second stage of the comparator 100 is about to enter a differential mode from a common mode. The common mode voltage at time T1 is usually determined by the ratios of a threshold voltage of the P-channel Metal-Oxide-Semiconductor Field-Effect Transistor (MOSFET) (P-channel MOSFET, hereinafter referred to as PMOS) to a threshold voltage of the N-channel MOSFET (hereinafter referred to as NMOS) of the inverter 210 and the inverter 220. After the second stage of the comparator 100 enters the differential mode, the voltages of the output signal VOP and the output signal VON are no longer equal. After time T2, the output signal VON exceeds the transition voltage VTH, causing a level transition to occur to the signal # Q. Since the output signal VOP remains below the transition voltage VTH in the entire comparison phase, no level transition occurs to the signal Q. From the beginning of the comparison phase to the end of the comparison phase, the logical values of the signal Q and the signal # Q change from (1,1) to (1,0), which is a correct operation of the comparator 100.

As shown in FIG. 3B, at time T1, the second stage of the comparator 100 is about to enter the differential mode from the common mode. However, before the second stage of the comparator 100 enters the differential mode (i.e., before time T1), the output signal VOP and the output signal VON have exceeded the transition voltage VTH, causing level transitions to occur to both the signal Q and the signal # Q. Then, the voltages of the output signal VOP and the output signal VON change from signals above the transition voltage VTH to signals below the transition voltage VTH at times T2 and T2', resulting in another level transition to each of the signal Q and the signal # Q. From the beginning of the comparison phase to the end of the comparison phase, the logical values of the signal Q and the signal # Q change in this order: (1,1)→(0,0)→(1,0)→(1,1), in which the transient logical values (0,0) may cause errors in the circuit that follows (i.e., the circuit taking the signal Q and the signal # Q as its input signals).

SUMMARY

In view of the issues of the prior art, an object of this disclosure is to provide a self-test circuit and a self-test method for comparators to avoid circuit malfunction.

A self-test circuit for a comparator is provided. The comparator has a first output terminal coupled to an input terminal of a first inverter and a second output terminal coupled to an input terminal a second inverter and operates in a reset phase or a comparison phase according to a clock. The self-test circuit includes a switch and a control circuit. The switch is coupled between the first output terminal and the second output terminal. The control circuit is coupled to the switch for controlling whether the switch is turned on. In a test mode, the control circuit controls the switch to be turned on, and, in the test mode, the comparator operates in the reset phase or the comparison phase according to the clock.

A self-test method for a comparator is also provided. The comparator has a first output terminal coupled to an input terminal of a first inverter and a second output terminal coupled to an input terminal a second inverter and operates in a reset phase or a comparison phase according to a clock. The self-test method includes steps of: causing the comparator to enter a test mode by coupling the first output terminal and the second output terminal, the first output terminal the second output terminal having substantially the same voltage in the test mode; and controlling the comparator to operate in the reset phase or the comparison phase in accordance with the clock in the test mode.

According to this disclosure, the self-test circuit and the self-test method for comparators can know whether an error occurs to the comparator and can selectively adjust the comparator when the error is detected, thereby avoiding failure in the circuits employing the comparator.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a self-test circuit and a self-test method for comparators. On account of that some or all elements of the self-test circuit could be known, the detail of such elements is omitted provided that such detail has little to do with the features of this disclosure and this omission nowhere dissatisfies the specification and enablement requirements. Some or all of the processes of self-test method may be implemented by software and/or firmware, and can be performed by the self-test circuit or its equivalent.

Figure 4:
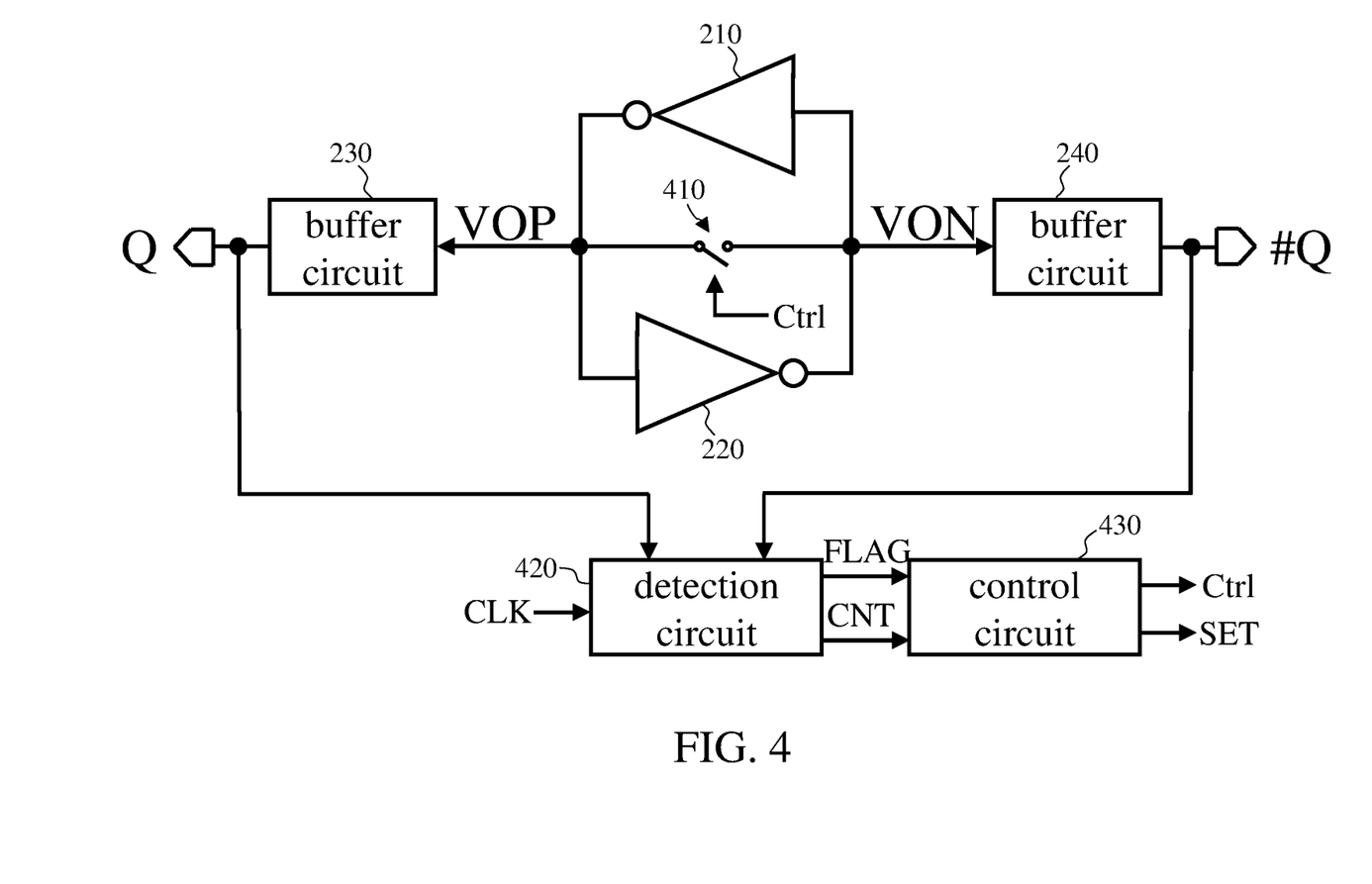
FIG. 4 shows a circuit diagram of a self-test circuit according to an embodiment of this disclosure.
Figure 5:
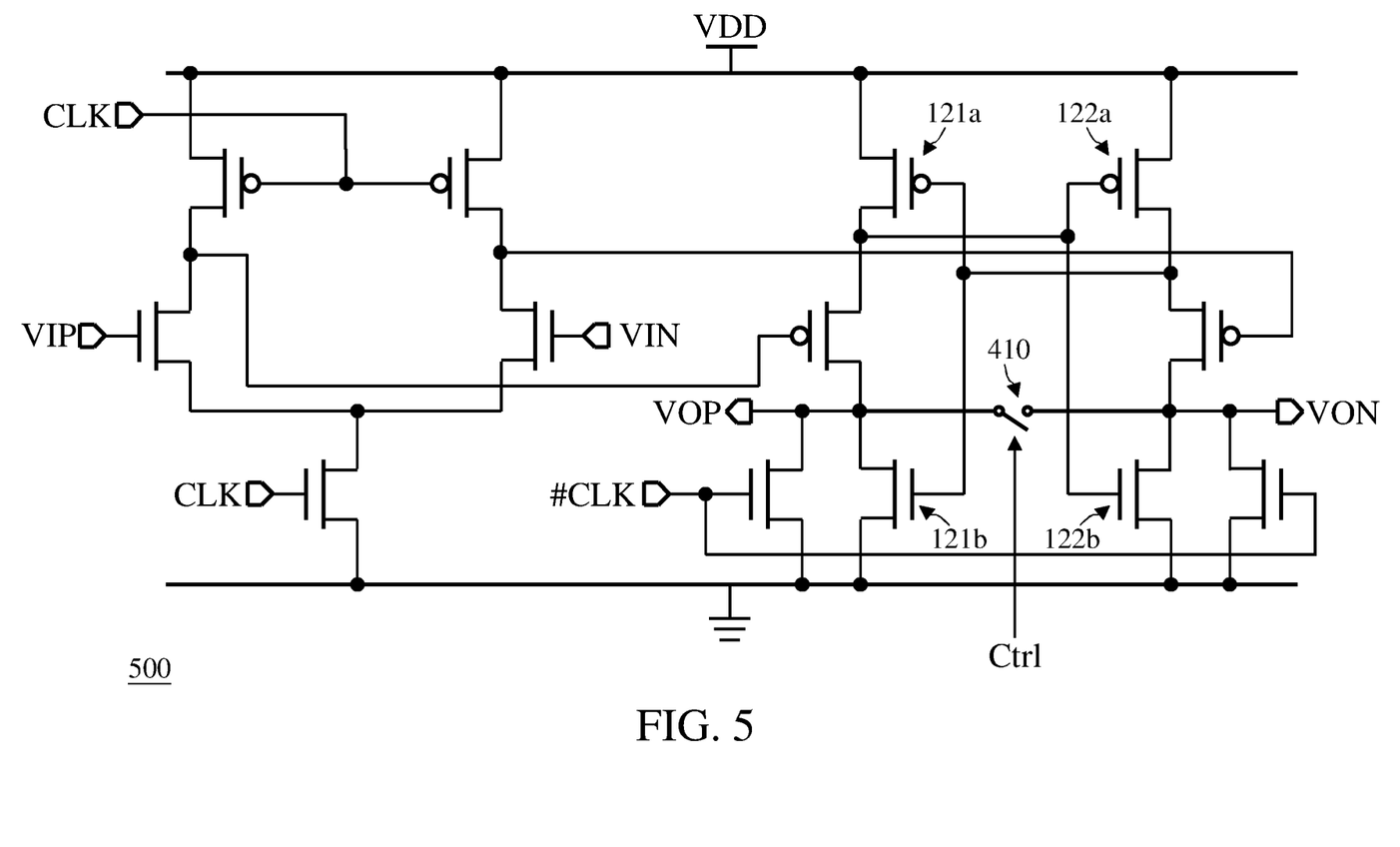
FIG. 5 shows a circuit diagram illustrating the implementation of a switch in a comparator.

FIG. 4 is a circuit diagram of a self-test circuit according to an embodiment of this disclosure. The self-test circuit includes a switch 410, a detection circuit 420, and a control circuit 430. The switch 410 is coupled between the output terminal of the inverter 210 and the output terminal of the inverter 220; the switch 410 is also coupled between the input terminal of the inverter 210 and the input terminal of the inverter 220. FIG. 5 is a circuit diagram illustrating the implementation of a switch in a comparator. The difference between the comparator 500 and the comparator 100 is that a switch 410 is coupled between the output terminals of the comparator 500. The control signal Ctrl outputted by the control circuit 430 controls the switch 410 to be turned on or off. When the switch 410 is turned on, the voltage of the output signal VOP is the same as that of the output signal VON. In some embodiments, the switch 410 can be implemented by a transistor or a transmission gate. It is assumed in the following discussion that the signal Q and the output signal VOP are each other's inverted signal, and the signal # Q and the output signal VON are each other's inverted signal, and that the voltage levels of the output signal VOP and the output signal VON are LOW (logic 0) when the comparator 500 is reset in the reset phase. These assumptions are for the purpose of explanation, not for limiting the scope of this disclosure. Other implementation variations of this disclosure become apparent to a person of ordinary skill in the art after reading the following description.

Figure 6:
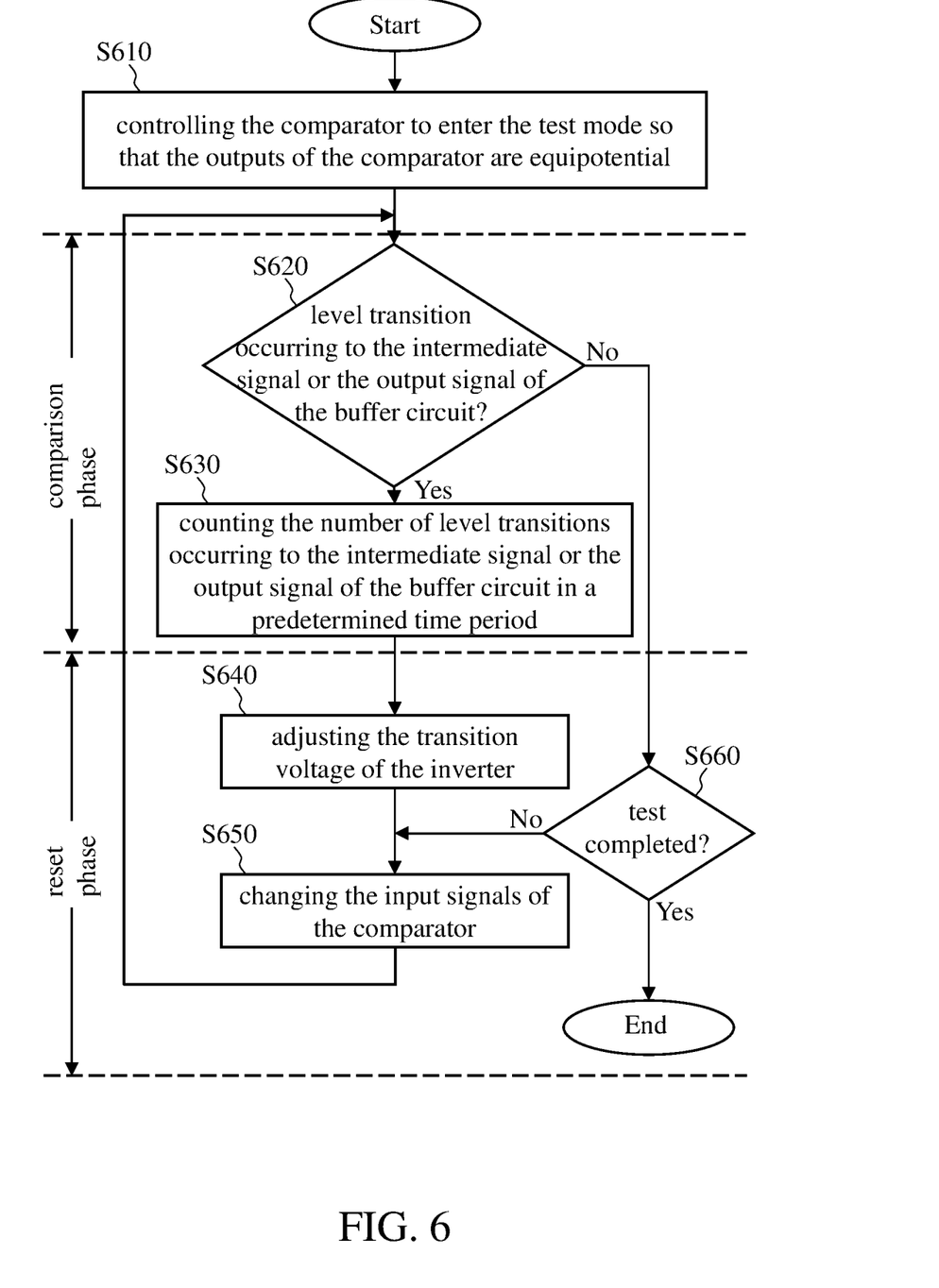
FIG. 6 shows a flowchart of a self-test method for comparators according to an embodiment of this disclosure.

Reference is made to FIG. 4 to FIG. 6. FIG. 6 is a flowchart of a self-test method for comparators according to an embodiment of this disclosure. When the test starts, the control circuit 430 controls the comparator 500 to enter the test mode by turning on the switch 410. In the test mode, the outputs of the comparator 500 are equipotential (i.e., equal in voltage level) (step S610). Next, the control circuit 430 controls the comparator 500 to operate in the comparison phase or the reset phase in accordance with the clock CLK. In the embodiment of FIG. 5, the comparator 500 is in the comparison phase when the clock CLK is at a high voltage level or HIGH (logic 1), and the comparator 500 is in the reset phase when the clock CLK is at a low voltage level or LOW. In the reset phase, the output signal VOP and the output signal VON of the comparator 500 are LOW. Next, the detection circuit 420 determines in the comparison phase whether a level transition occurs to the output signal(s) of the buffer circuit 230 and/or the buffer circuit 240 (i.e., the signal Q and/or the signal # Q) (step S620).

Figure 7:
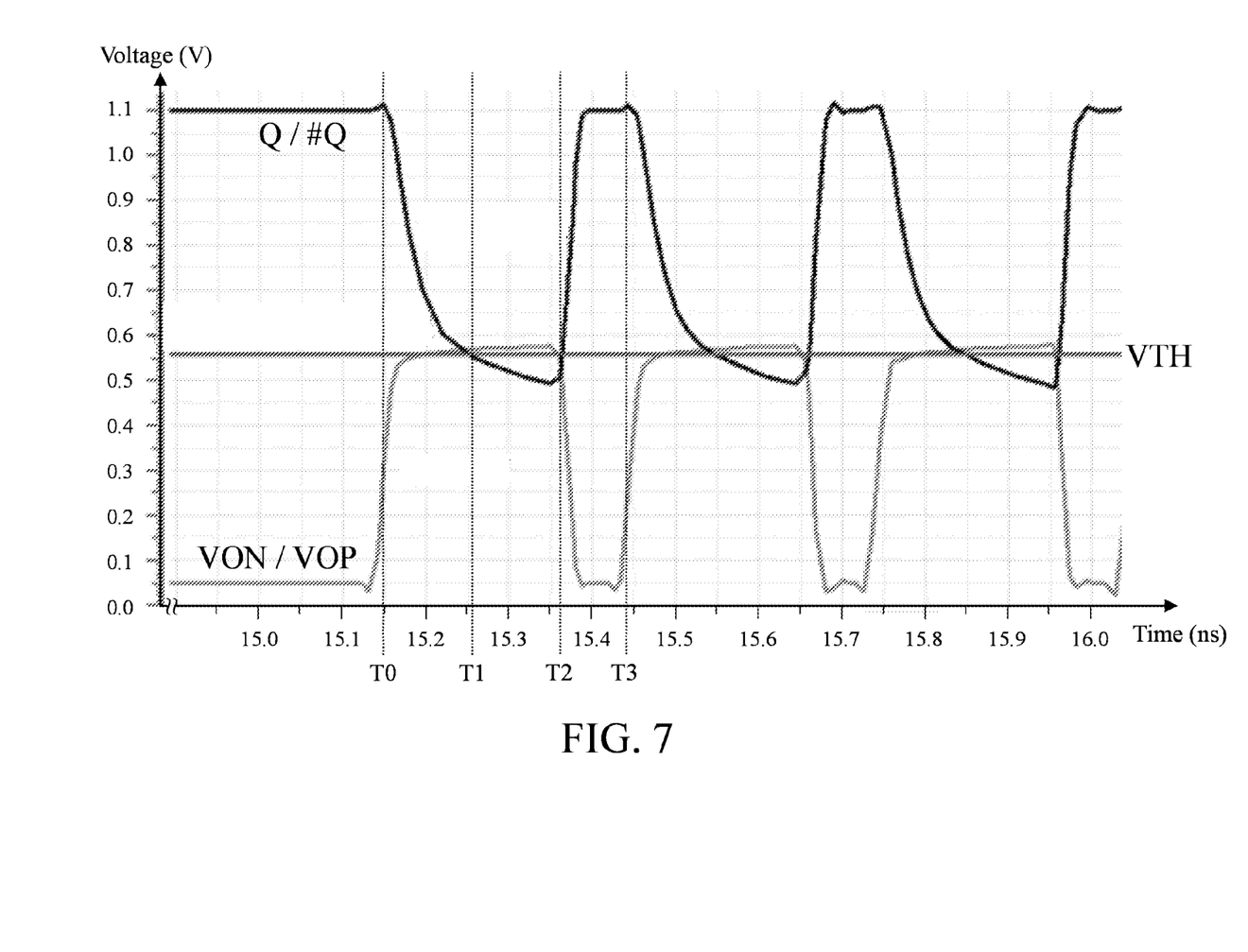
FIG. 7 is a diagram showing that the output signal of the comparator crosses the transition voltage of the buffer circuit in the test mode.

FIG. 7 is a diagram showing that the output signal of the comparator (i.e., the output signal VOP or the output signal VON) crosses the transition voltage of the buffer circuit in the test mode. The duration from time T0 to time T3 is one operation cycle of the comparator 500, which includes the comparison phase (T0 to T2) and the reset phase (T2 to T3). When the output terminal of the inverter 210 and the output terminal of the inverter 220 are shorted (i.e., when the switch 410 is turned on), the inverter 210 and the inverter 220 cannot enter the differential mode. The maximum value of the output signal VON/VOP in FIG. 7 is approximately the maximum voltage (about 0.57 V in FIG. 7) of the common mode of the inverter 210 and the inverter 220, the maximum voltage of the common mode being the transition voltage of the inverter 210 and the inverter 220. As shown in the figure, the output signal VOP/VON crosses the transition voltage VTH of the buffer circuit 230 and the buffer circuit 240 in the comparison phase, causing the signal Q and the signal # Q to exit the reset state (i.e., a level transition occurs to the signal Q and the signal # Q), which in turn generates transient logical values (0,0). In other words, the occurrence that the signal Q and the signal #Q both exit the reset state while the inverter 210 and the inverter 220 are still in the common mode indicates that the signal Q and the signal #Q have transient logical levels; this occurrence is mainly caused by the circumstance that the transition voltage of the inverter 210 and the inverter 220 is too close to the transition voltage VTH of the buffer circuit 230 and the buffer circuit 240. In order to ensure that the comparator 500 operates correctly, different approaches should be taken for different cases: (1) the logical values of the output signal VOP and the output signal VON are both logic 0 when reset (as shown in the example of FIG. 7); and (2) the logical values of the output signal VOP and the output signal VON are both logic 1 when reset. With respect to case (1), the transition voltages of the inverter 210 and the inverter 220 should be smaller than the transition voltage VTH of the buffer circuit 230 and the buffer circuit 240 by a default value (e.g., 500 mV). With respect to case (2), the transition voltages of the inverter 210 and the inverter 220 should be greater than the transition voltage VTH of the buffer circuit 230 and the buffer circuit 240 by a default value.

In some embodiments, when the detection circuit 420 detects that a level transition occurs to one of the signal Q and the signal #Q, the detection circuit 420 changes the voltage level of the flag FLAG. In other embodiments, when the detection circuit 420 detects that a level transition occurs to both the signal Q and the signal #Q, the detection circuit 420 changes the voltage level of the flag FLAG. For example, the detection circuit 420 may contain a logic gate that takes the signal Q and the signal #Q as its inputs and the flag FLAG as its output. Table 1 shows the logical values of the signal Q and signal #Q in the reset state and the suitable logic gate. From the point of view of the analog signal, when the signal Q and the signal #Q move from the reset state towards a point relatively far from the reset value (i.e., the transition voltage of the inverter 210/220 is relatively close to the transition voltage of the buffer circuit 230/240), the voltage of the flag FLAG changes significantly.

TABLE 1

| logical value of signal Q and signal #Q in the reset state | suitable logic gate |
|---|---|
| 0 | NOR gate |
| 1 | NAND gate |

Reference is made back to FIG. 6. When step S620 is positive, the detection circuit 420 may further count the number of level transitions occurring to the signal Q and/or the signal #Q and/or the flag FLAG in a predetermined time period in the comparison phase to thereby generate a count value CNT (step S630). For example, the detection circuit 420 may contain a counter and determine the predetermined time period according to the clock CLK. The greater the count value CNT, the smaller the minimum voltage of the signal Q and/or the signal #Q may be in the comparison phase (corresponding to the case where the logical values of the signal Q and the signal #Q are logic 1 when reset), or the greater the maximum voltage of the signal Q and/or the signal #Q may be in the comparison phase (corresponding to the case where the logical values of the signal Q and the signal #Q are logic 0 when reset). In either case, a greater count value CNT indicate that the transition voltages of the inverter 210 and the inverter 220 are closer to the transition voltages of the buffer circuit 230 and the buffer circuit 240.

The transition voltage of the buffer circuit refers to the transition voltage of any inverter in the buffer circuit. In some embodiments, the transition voltage of the buffer circuit may refer to the transition voltage of the inverter directly coupled to the comparator. Note that step S630 is optional.

Figure 8:
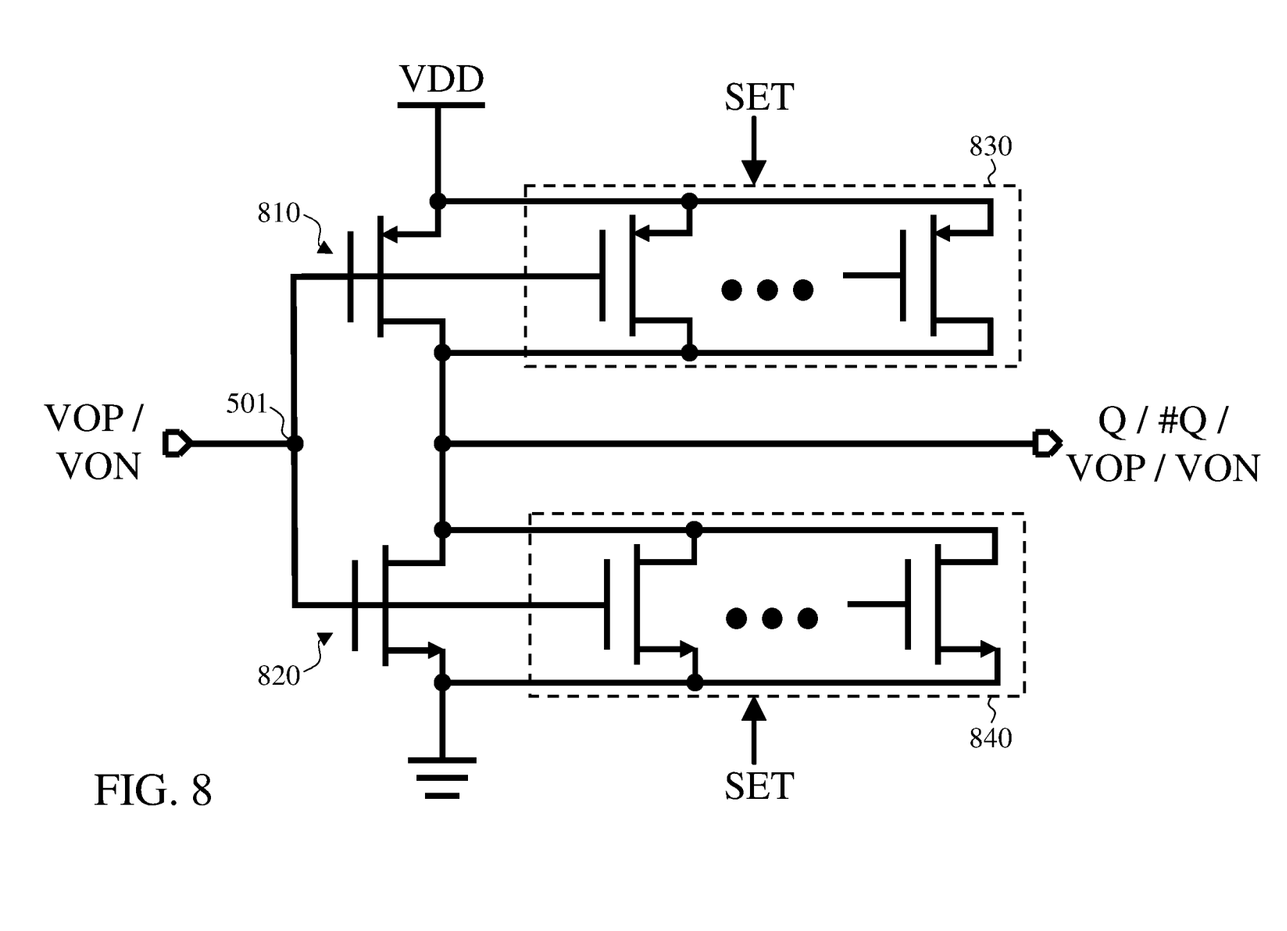
FIG. 8 shows a mechanism for adjusting the inverter's transition voltage according to an embodiment of this disclosure.

Next, the control circuit 430 outputs the setting signal SET in the reset phase to adjust the transition voltage of the inverter (step S640). The adjustment mechanism is shown in FIG. 8. The PMOS 810 and the NMOS 820 constitute an inverter, which can refer to the inverter 210, the inverter 220, or an inverter of the buffer circuit 230/240. The PMOS array 830 includes at least one PMOS, and the NMOS array 840 includes at least one NMOS. The setting signal SET can determine: (1) the number of transistors (zero or at least one) in the PMOS array 830 that are in parallel with the PMOS 810; or (2) the number of transistors (zero or at least one) in the NMOS array 840 that are in parallel with the NMOS 820. The PMOS array 830 and the NMOS array 840 are parts of the self-test circuit.

The greater the number of transistors in the PMOS array 830 that are connected in parallel with the PMOS 810, the greater the transition voltage of the inverter that is formed by the PMOS 810 and the NMOS 820. The greater the number of transistors in the NMOS array 840 connected that are in parallel with the NMOS 820, the smaller the transition voltage of the inverter that is formed by the PMOS 810 and the NMOS 820. Each time the control circuit 430 adjusts the transition voltage of the inverter (i.e., each time step S640 is performed), the control circuit 430 controls the number of transistors in the PMOS array 830 (or the NMOS array 840) that are connected in parallel with the PMOS 810 (or the NMOS 820) to be increased by N (N is a positive integer). There are two approaches for the control circuit 430 to determine the value of N: (1) based on a predetermined step value, that is, N is a fixed value; or (2) based on the count value CNT of step S630, that is, N being proportional to the count value CNT of step S630, for example, the greater the count value CNT, the greater the value of N. In one adjustment, the control circuit 430 controls one of the PMOS array 830 and the NMOS array 840 with the setting signal SET.

In some embodiments, in one adjustment, the control circuit 430 can also control the number of transistors in the PMOS array 830 and the number of transistors in the NMOS array 840 with the setting signal SET, thereby adjusting the ratio of the number of transistors in the PMOS array 830 to the number of transistors in the NMOS array 840.

It should be noted that two transistors connected in parallel have their gates electrically connected to each other, their drains electrically connected to each other, and their sources electrically connected to each other. In some embodiments, the drain and the source of each PMOS in the PMOS array 830 are each coupled to a switch, with the switch corresponding to the drain coupled to the drain of the PMOS 810, and the switch corresponding to the source coupled to the source of the PMOS 810. The switches are controlled by the setting signal SET. In some embodiments, the drain and the source of each NMOS in the NMOS array 840 are each coupled to a switch, with the switch corresponding to the drain coupled to the drain of the NMOS 820, and the switch corresponding to the source coupled to the source of the NMOS 820. The switches are controlled by the setting signal SET.

In the case where the output signal VOP and the output signal VON are reset to have the logical value of 0 (as in the example shown in FIG. 7), the control circuit 430 can, in step S640, increase the transition voltages of the buffer circuit 230 and the buffer circuit 240, or decrease the transition voltages of the inverter 210 and the inverter 220, so as to ensure that the transition voltages of the inverter 210 and the inverter 220 are smaller than the transition voltages of the buffer circuit 230 and the buffer circuit 240 by a default value. In the case where the output signal VOP and the output signal VON are reset to have the logical value of 1, the control circuit 430 can, in step S640, decrease the transition voltages of the buffer circuit 230 and the buffer circuit 240, or increase the transition voltages of the inverter 210 and the inverter 220, so as to ensure that the transition voltages of the inverter 210 and the inverter 220 are greater than the transition voltages of the buffer circuit 230 and the buffer circuit 240 by a default value. In step S640, the control circuit 430 increases or decreases the transition voltages of the inverter 210 and the inverter 220 by the same magnitude, or increases or decreases the transition voltages of the buffer circuit 230 and the buffer circuit 240 by the same magnitude. In some embodiments, either before the adjustment or after the adjustment, the inverter 210 and inverter 220 have substantially the same transition voltage, and the buffer circuit 230 and buffer circuit 240 have substantially the same transition voltage.

After step S640 is completed, the control circuit 430 changes the input signals of the comparator 500 (step S650). Next, the comparator 500 returns to the comparison phase, and step S620 is performed again.

When step S620 is negative, the control circuit 430 determines whether the test is completed (step S660). When the test is completed, the control circuit 430 controls the switch 410 to turn off, causing the comparator 500 to exit the test mode. If the test is not completed, the control circuit 430 changes the input signals of the comparator 500 (step S650), and then the comparator 500 returns to the comparison phase, and step S620 is performed again.

Please note that in some practical tests that require high reliability, when step S620 is positive, the comparator is discarded and the subsequent analysis step (step S630) and adjustment step (step S640) are neglected. In some embodiments, the detection circuit 420 and the control circuit 430 are digital circuits, and the control circuit 430 can be implemented by logic gates, a finite state machine, and/or a digital signal processing circuit. In other embodiments, the detection circuit 420 can also detect the voltage(s) of the signal Q and/or the signal # Q and/or the flag FLAG in the analog domain, and signal the control circuit 430 to adjust the transition voltage when the voltage(s) of the signal Q and/or the signal # Q and/or the flag FLAG is/are greater or smaller than a predetermined voltage level.

Figure 9A:
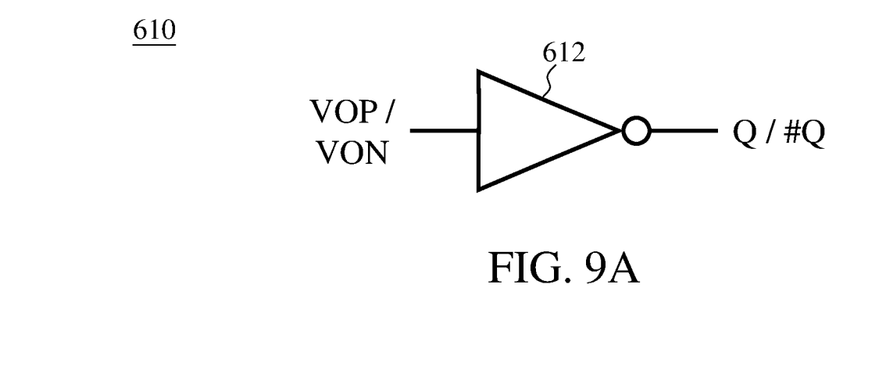
FIG. 9A-9B show the internal circuit of the buffer circuit of this disclosure.
Figure 9B:
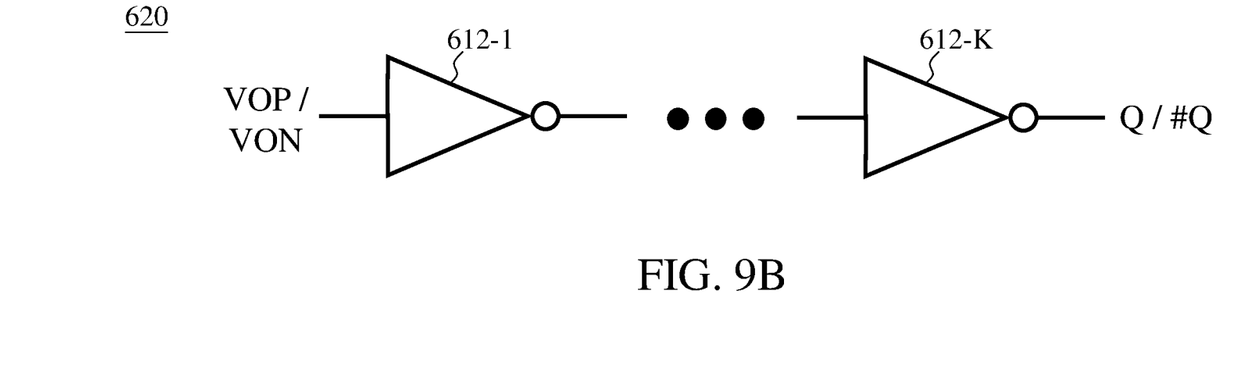

FIGS. 9A and 9B show the internal circuit of the buffer circuit according to this disclosure. The buffer circuit 230 and the buffer circuit 240 can be implemented by the buffer circuit 610 or the buffer circuit 620. As shown in FIG. 9A, the buffer circuit 610 contains only one inverter 612, and the transition voltage of the buffer circuit 610 is the transition voltage of the inverter 612. As shown in FIG. 9B, the buffer circuit 620 contains K serially connected inverters 612 (612-1, 612-2, . . . , 612-K, K is an integer greater than or equal to 2), and the transition voltage of the buffer circuit 620 can be the transition voltage of the inverter 612-1.

Figure 10:
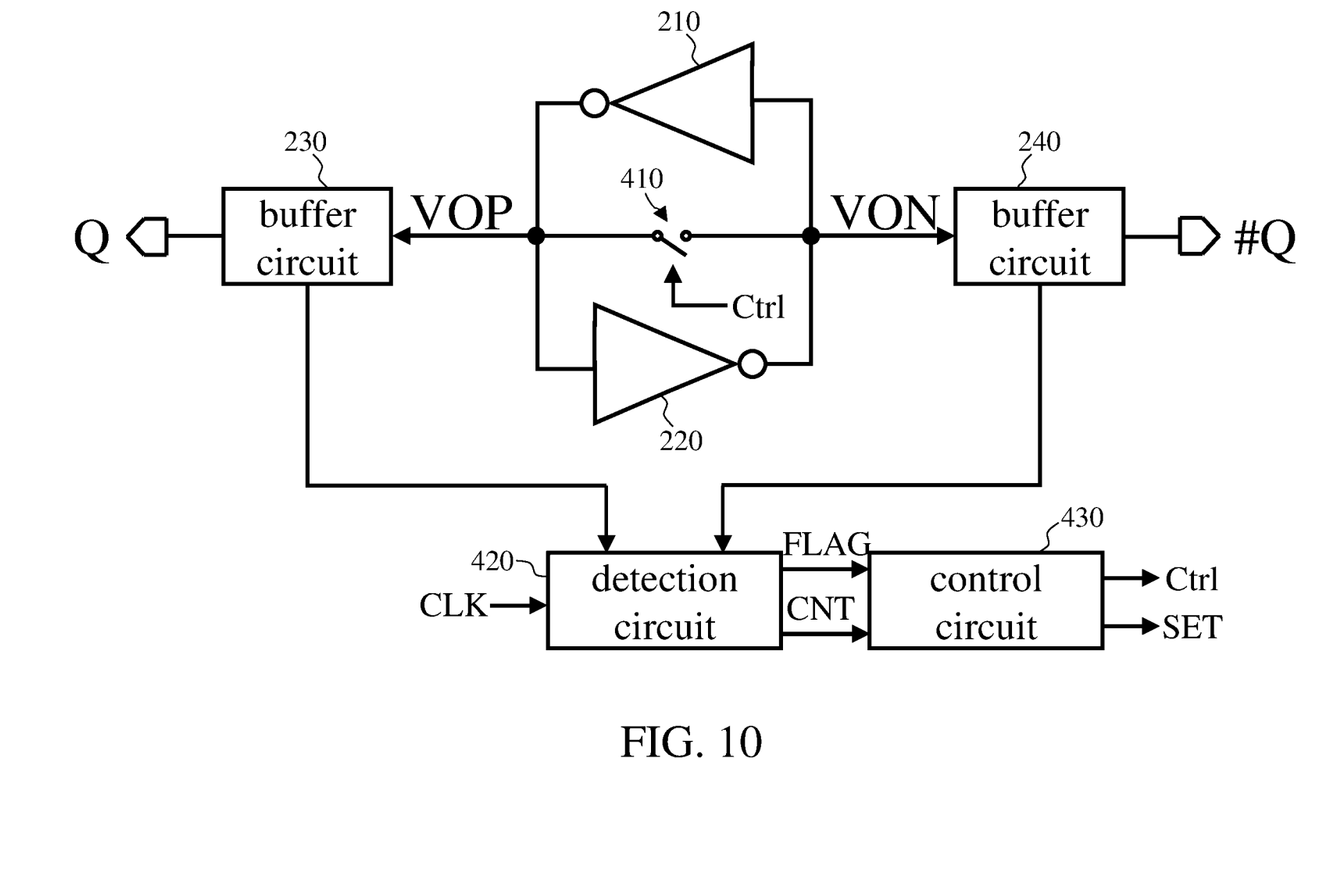
FIG. 10 shows a circuit diagram of a self-test circuit according to another embodiment of this disclosure

FIG. 10 is a circuit diagram of a self-test circuit according to another embodiment of this disclosure. The embodiment of FIG. 10 is similar to the embodiment of FIG. 4, except that the detection circuit 420 detects the intermediate signal of the buffer circuit 230 and/or the buffer circuit 240 (i.e., the detection circuit 420 detects the intermediate signal in steps S620 and S630). As shown in FIG. 9B, the intermediate signal of the buffer circuit 620 refers to the output of any inverter in the buffer circuit 620, other than the signal Q and the signal # Q; namely, the intermediate signal refers to the output of any inverter but the terminal inverter (i.e., the inverter 612-K) in the buffer circuit 620.

Please note that this disclosure can also be applied to the two-stage comparator discussed in the following documents. Although the foregoing embodiment is exemplified by a two-stage comparator, this is not a limitation to this disclosure. Those skilled in the art can apply this disclosure to other types of comparators according to this disclosure.

1. T. Kobayashi, K. Nogami, T. Shirotori, and Y. Fujimoto "A current-controlled latch sense amplifier and a static power-saving input buffer for low-power architecture," *Solid-State Circuits, IEEE Journal of*, vol. 28, pp. 523-527, April 1993.
2. Daniël Schinkel, Eisse Mensink, Eric Klumperink, Ed van Tuijl, and Bram Nauta, "A Low-Offset Double-Tail Latch-Type Voltage Sense Amplifier," *Digest of Technical Papers. IEEE International Solid-State Circuits Conference*, pp. 89-94, 2007.
3. Masaya Miyahara, Yusuke Asada, Daehwa Paik, and Akira Matsuzawa, "A Low-Noise Self-Calibrating Dynamic Comparator for High-Speed ADCs," *IEEE Asian Solid-State Circuits Conference, pp.* 269-272, November 2008.

Since a person having ordinary skill in the art can appreciate the implementation detail and the modification thereto of the present method embodiment through the disclosure of the device embodiment, repeated and redundant description is thus omitted. Please note that there is no step sequence limitation for the method embodiments as long as the execution of each step is applicable. Furthermore, the shape, size, and ratio of any element and the step sequence of any flow chart in the disclosed figures are exemplary for understanding, not for limiting the scope of this disclosure.

The aforementioned descriptions represent merely the preferred embodiments of this disclosure, without any intention to limit the scope of this disclosure thereto. Various equivalent changes, alterations, or modifications based on the claims of this disclosure are all consequently viewed as being embraced by the scope of this disclosure.

What is claimed is:
1. A self-test circuit for a comparator, wherein the comparator has a first output terminal coupled to an input terminal of a first inverter and a second output terminal coupled to an input terminal a second inverter and operates in a reset phase or a comparison phase according to a clock, the self-test circuit comprising:
   a switch coupled between the first output terminal and the second output terminal; and
   a control circuit coupled to the switch for controlling whether the switch is turned on;
   wherein, in a test mode, the control circuit controls the switch to be turned on, and, in the test mode, the comparator operates in the reset phase or the comparison phase according to the clock.
2. The self-test circuit of claim 1 further comprising:
   a detection circuit configured to receive a first signal and a second signal and detect whether a level transition occurs to the first signal and/or the second signal, wherein the first signal is a first output signal of the first inverter or a signal generated by inverting the first output signal at least once, and the second signal is a second output signal of the second inverter or a signal generated by inverting the second output signal at least once.

3. The self-test circuit of claim 2, wherein the detection circuit further counts in a predetermined time period a total number of level transitions occurring to the first signal and/or the second signal.

4. The self-test circuit of claim 2, wherein when the detection circuit determines that a level transition occurs to the first signal and/or the second signal, the control circuit adjusts transition voltages of the first inverter and the second inverter.

5. The self-test circuit of claim 4, wherein the first output terminal outputs a third output signal, the second output terminal outputs a fourth output signal, and in a case where the third output signal and the fourth output signal are reset to logic 0 in the reset phase, the control circuit increases the transition voltages of the first inverter and the second inverter.

6. The self-test circuit of claim 4, wherein the first output terminal outputs a third output signal, the second output terminal outputs a fourth output signal, and in a case where the third output signal and the fourth output signal are reset to logic 1 in the reset phase, the control circuit decreases the transition voltages of the first inverter and the second inverter.

7. The self-test circuit of claim 2, wherein the comparator comprises a third inverter and a fourth inverter, and the control circuit adjusts transition voltages of the third inverter and the fourth inverter when the detection circuit determines that a level transition occurs to the first signal and/or the second signal.

8. The self-test circuit of claim 7, wherein the first output terminal outputs a third output signal, the second output terminal outputs a fourth output signal, and in a case where the third output signal and the fourth output signal are reset to logic 0 in the reset phase, the control circuit decreases the transition voltages of the third inverter and the fourth inverter.

9. The self-test circuit of claim 7, wherein the first output terminal outputs a third output signal, the second output terminal outputs a fourth output signal, and in a case where the third output signal and the fourth output signal are reset to logic 1 in the reset phase, the control circuit increases the transition voltages of the third inverter and the fourth inverter.

10. A self-test method for a comparator, wherein the comparator has a first output terminal coupled to an input terminal of a first inverter and a second output terminal coupled to an input terminal a second inverter and operates in a reset phase or a comparison phase according to a clock, the self-test method comprising:
causing the comparator to enter a test mode by coupling the first output terminal and the second output terminal, wherein, in the test mode, the first output terminal and the second output terminal have substantially the same voltage; and
controlling the comparator to operate in the reset phase or the comparison phase in accordance with the clock in the test mode.

11. The self-test method of claim 10 further comprising:
detecting whether a level transition occurs to a first signal and/or a second signal;
wherein the first signal is a first output signal of the first inverter or a signal generated by inverting the first output signal at least once, and the second signal is a second output signal of the second inverter or a signal generated by inverting the second output signal at least once.

12. The self-test method of claim 11 further comprising:
counting in a predetermined time period a total number of level transitions occurring to the first signal and/or the second signal.

13. The self-test method of claim 11 further comprising:
adjusting transition voltages of the first inverter and the second inverter when a level transition occurs to the first signal and/or the second signal.

14. The self-test method of claim 13, wherein the first output terminal outputs a third output signal, the second output terminal outputs a fourth output signal, and in a case where the third output signal and the fourth output signal are reset to logic 0 in the reset phase, the step of adjusting the transition voltages of the first inverter and the second inverter comprises:
increasing the transition voltages of the first inverter and the second inverter.

15. The self-test method of claim 13, wherein the first output terminal outputs a third output signal, the second output terminal outputs a fourth output signal, and in a case where the third output signal and the fourth output signal are reset to logic 1 in the reset phase, the step of adjusting the transition voltages of the first inverter and the second inverter comprises:
decreasing the transition voltages of the first inverter and the second inverter.

16. The self-test method of claim 11, wherein the comparator comprises a third inverter and a fourth inverter, and the method further comprises:
adjusting transition voltages of the third inverter and the fourth inverter when a level transition occurs to the first signal and/or the second signal.

17. The self-test method of claim 16, wherein the first output terminal outputs a third output signal, the second output terminal outputs a fourth output signal, and in a case where the third output signal and the fourth output signal are reset to logic 0 in the reset phase, the step of adjusting the transition voltages of the third inverter and the fourth inverter comprises:
decreasing the transition voltages of the third inverter and the fourth inverter.

18. The self-test method of claim 17, wherein the first output terminal outputs a third output signal, the second output terminal outputs a fourth output signal, and in a case where the third output signal and the fourth output signal are reset to logic 1 in the reset phase, the step of adjusting the transition voltages of the third inverter and the fourth inverter comprises:
increasing the transition voltages of the third inverter and the fourth inverter.

* * * * *